United States Patent
Hermann (10) Patent No.: US 11,061,426 B2
(45) Date of Patent: Jul. 13, 2021

(54) VOLTAGE REFERENCE CIRCUIT WITH COMBINED POWER-ON RESET

(71) Applicant: Robert Bosch GmbH, Stuttgart (DE)

(72) Inventor: Carsten Hermann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/962,183

(22) PCT Filed: Jan. 16, 2019

(86) PCT No.: PCT/EP2019/050988
§ 371 (c)(1),
(2) Date: Aug. 17, 2020

(87) PCT Pub. No.: WO2019/141697
PCT Pub. Date: Jul. 25, 2019

(65) Prior Publication Data
US 2020/0379498 A1  Dec. 3, 2020

(30) Foreign Application Priority Data
Jan. 18, 2018 (DE) .................. 10 2018 200 785.3

(51) Int. Cl.
*G05F 3/26* (2006.01)
*B60R 16/03* (2006.01)
(Continued)

(52) U.S. Cl.
CPC .............. *G05F 3/267* (2013.01); *B60R 16/03* (2013.01); *G05F 3/30* (2013.01); *H03K 3/0377* (2013.01);
(Continued)

(58) Field of Classification Search
CPC ... G05F 3/267; G05F 3/30; G05F 3/26; B60R 16/03; H03K 3/0377; H03K 17/223; H03K 2017/226
See application file for complete search history.

(56) References Cited

U.S. PATENT DOCUMENTS

2002/0141121 A1   10/2002   Brohlin
2009/0121699 A1*  5/2009   Park .................... G05F 3/30
                                          323/313
(Continued)

FOREIGN PATENT DOCUMENTS

EP   1063578 A1   12/2000
EP   1852766 A1   11/2007

OTHER PUBLICATIONS

International Search Report dated May 7, 2019 in connection with International Application No. PCT/EP2019/050988.

*Primary Examiner* — Jung Kim
(74) *Attorney, Agent, or Firm* — Norton Rose Fulbright US LLP; Gerard Messina (57) ABSTRACT

A voltage reference circuit serves to furnish a reference voltage for an application-specific integrated circuit. The voltage reference circuit includes a voltage input for applying an operating voltage; a ground terminal; a voltage output for furnishing a reference voltage; and a signal output for furnishing a power-on reset signal. The voltage reference circuit includes an IPTAT circuit, connected between the voltage input and ground terminal, for generating a current proportional to the absolute temperature, the voltage reference circuit being embodied to furnish the power-on reset signal only if the reference voltage has reached a target value and if additionally a current is flowing in the IPTAT circuit with a quantity of current that reaches or exceeds a minimum (Continued)

current intensity determined by a voltage value of the operating voltage and by a pull-down resistance value.

10 Claims, 2 Drawing Sheets

(51) Int. Cl.
*H03K 3/037* (2006.01)
*H03K 17/22* (2006.01)
*G05F 3/30* (2006.01)

(52) U.S. Cl.
CPC ..... *H03K 17/223* (2013.01); *H03K 2017/226* (2013.01)

(56) References Cited

U.S. PATENT DOCUMENTS

2013/0120026 A1 5/2013 Zanchi
2015/0109054 A1 4/2015 Vilas Boas et al.

\* cited by examiner

Fig. 1
EXISTING ART

Fig. 2

VOLTAGE REFERENCE CIRCUIT WITH COMBINED POWER-ON RESET

FIELD

The present invention relates to a voltage reference circuit having a combined power-on reset signal.

BACKGROUND INFORMATION

Figure 1:
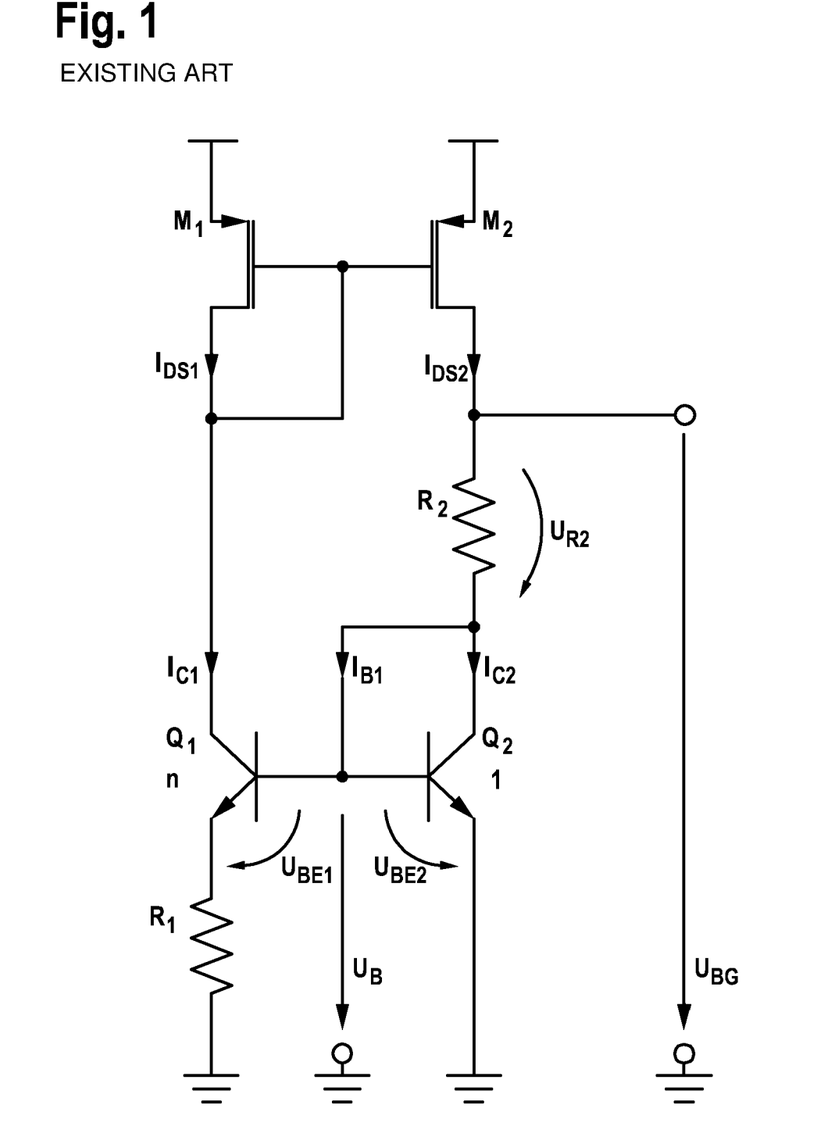
FIG. 1 shows a bandgap voltage reference circuit according to the existing art.

In application-specific integrated circuits (ASICs) and other circuits, a voltage reference is often required; it is utilized for voltage regulators, comparators, the internal reset monitoring function, derivation of reference currents, and other purposes. The bandgap principle can be used, for example, to furnish a voltage reference. An example of a conventional voltage reference circuit according to the existing art, which functions according to the bandgap principle, is depicted in FIG. 1. It is based on a current mirror circuit that is connected to a voltage input at which an operating voltage is present. The current mirror encompasses MOS transistors M1, M2 of identical type whose gates are connected to one another. For a first of MOS transistors M1, the gate is furthermore connected to the drain terminal. This first MOS transistor M1 is connected with its drain terminal directly to the collector of a first bipolar transistor Q1. The emitter of first bipolar transistor Q1 is connected via a first resistor to ground. The base of first bipolar transistor Q1 is connected to the base of a second bipolar transistor Q2. For second bipolar transistor Q2, the base is furthermore connected to the collector. The collector of second bipolar transistor Q2 is connected via a second resistor R2 to the drain terminal of MOS transistor M2. The circuit makes the reference voltage UBG available at the drain terminal of MOS transistor M2.

Using current mirrors it is possible to generate a current that is identical to an existing current, or a current that has a fixed relationship to the existing current. The latter variant uses, for example, bipolar or MOS transistors that are identical or identically shaped in terms of conformation, but are not identical in area. The ratio between the currents can thereby be defined, via the area ratios of the active surfaces, emitter surfaces, or gate surfaces, solely by way of their areas.

The two bipolar transistors are of identical type, i.e., identical or the same in terms of their conformation. They are not identical in area, however. The area of bipolar transistor Q1 is greater by a factor n than that of bipolar transistor Q2, n being a natural number greater than 1. n is therefore the size ratio between Q1 and Q2.

Together with the current feedback of bipolar transistor Q1 which is caused by IPTAT circuit resistor R1, different current/voltage characteristic curves IC1(UB) and IC2(UB) are produced for bipolar transistors Q1, Q2. The current mirror made up of M1 and M2 establishes, for both bipolar transistors, the working point at which both its base voltage UB and its collector currents IC1 and IC2 are identical. The base-emitter voltage UBE2 of Q2 is greater, by an amount $\Delta UBE = kT/q \times \ln(n)$, than the base-emitter voltage UBE1 of Q1, where k is the Boltzmann constant, T the absolute temperature, and q the charge of an electron. The voltage difference $\Delta UBE$, together with the selection of the IPTAT circuit resistor R1, defines the respective collector currents IC1 of Q1 and IC2 of Q2, and the respective drain-source currents IDS1 of M1 and IDS2 of M2, where $IC1 = IC2 = IDS1 = IDS2 = IPTAT = 1/R1 \times kT/q \times \ln(n)$. The current IPTAT is highly temperature-dependent, being proportional to absolute temperature (PTAT). This current increases by a factor of two within a temperature range, from −40° C. to 150° C., which is usual in many applications, for example in the automotive sector. At the same time, however, the base-emitter voltage of bipolar transistors Q1 and Q2 is also highly temperature-dependent, decreasing by half within the aforementioned usual temperature range. Both the temperature profile of the base-emitter voltages and the temperature profile of the collector currents are almost linear. Appropriate selection of resistor R2 therefore makes it possible for the sum UBG of the voltage drop UR2 across R2 (resulting from the collector current IC2 flowing through it) and the base-emitter voltage UBE2 to be independent of temperature to a first approximation. This total voltage UBG is referred to as a "bandgap voltage." It is equal to approximately 1.25V regardless of the semiconductor technology that is used. This bandgap voltage reference circuit requires a startup circuit, since the condition IC1=IC2 is also met for a current of 0.

The voltage reference circuit shown in FIG. 1 can operate correctly only above a specific operating voltage. The reference voltage UBG=UR2+UBE2 can be reached only if the operating voltage is high enough that the above-described working point can be established. That also requires that a drain-source voltage UDS2 (drain-source saturation voltage) of approx. 200 mV or more be capable of being established for MOS transistor M2. The voltage reference circuit shown in FIG. 1 can therefore operate properly only at an operating voltage of approx. 1.5 V.

It is the case, in principle, that the reference voltage is valid only above a specific minimum required operating voltage. Below That it is too low, and cannot be used as a voltage reference for downstream circuits such as voltage regulators and/or comparators. In any case, the ramping-up and ramping-down operating voltage passes through voltage ranges in which the reference voltage cannot assume its target value.

A practical need arises for being able to ascertain when a voltage reference circuit is operating correctly. This requires, at least, monitoring whether the operating voltage that is made available has reached its minimum required value. Reaching the minimum operating voltage is, however, also only a necessary, but not a sufficient, condition for correct operation of the voltage reference circuit, and is thus also only an indirect indicator.

With the aid of a power-on reset circuit it is possible to signal when the operating voltage being made available is high enough. What is often important here as well is the availability of the voltage reference circuit, so that the operating voltage threshold above which operational readiness is signaled cannot be set arbitrarily high.

Availability must be balanced against safety margin. Because the two circuits operate mutually independently, the risk exists that the power-on reset signal of the power-on reset circuit might be erroneously enabled during ramp-up or ramp-down of the operating voltage. For a specific magnitude and rate of increase in the operating voltage, and depending on the previous time course of the internal voltage nodes, for example, it might happen that the power-on reset signal of the power-on reset circuit becomes erroneously enabled even though the reference voltage of the voltage reference circuit is too low. This can cause malfunctions in other circuit portions of the ASIC. The additional power-on reset circuit requires an additional supply current.

It is apparent in practice, unfortunately, that problems that occur during the ramp-up and ramp-down of systems often are not discovered in the circuit simulator. They often become evident only when engineering samples of the relevant ASIC are available, and even then, unfortunately, are sometimes discovered only by accident. A power-on reset signal that assumes the wrong state during ramp-up or ramp-down is often a reason for redesigning an ASIC.

Power-on reset circuits of the existing art which are based on the bandgap principle can signal more or less accurately when the ramping-up and ramping-down operating voltage exceeds or falls below a specific target value. That power-on reset threshold can provide information as to whether the available operating voltage is sufficient to operate a voltage reference circuit. Ultimately, however, it is always a matter of combining two circuits operating separately from one another: the actual voltage reference circuit, and a circuit for generating the power-on reset. This carries the risk, however, that arises from the balance between availability and the magnitude of the safety margin between the highest operating voltage required for the voltage reference circuit and the lowest power-on reset threshold. Dynamic effects, and a finite accuracy of the power-on reset threshold, can make it necessary to further enlarge that safety margin.

SUMMARY

In accordance with the present invention, a voltage reference circuit is provided. The voltage reference circuit serves to furnish a reference voltage for an application-specific integrated circuit. According to an example embodiment of the present invention, the voltage reference circuit includes: a voltage input for applying an operating voltage; a ground terminal; a voltage output for furnishing a reference voltage; and a signal output for furnishing a power-on reset signal. The voltage reference circuit includes an IPTAT circuit, connected between the voltage input and ground terminal, for generating a current proportional to the absolute temperature. The voltage reference circuit is embodied to furnish the power-on reset signal only if the reference voltage has reached a target value and if additionally a current is flowing in the IPTAT circuit at a current intensity that reaches or exceeds a minimum current intensity determined by a voltage value of the operating voltage and by a pull-down resistance value.

According to the present invention, the generation of a reference voltage and generation of a power-on reset signal are combined in one circuit. The power-on reset signal can therefore be generated depending on whether the reference voltage of the voltage reference circuit has reached a target value while at the same time current is flowing in the IPTAT circuit. The power-on reset signal of the present invention therefore indicates the operational readiness of the voltage reference.

This prevents the reference voltage and the power-on reset threshold from diverging, since the reference voltage that becomes established simultaneously constitutes the power-on reset threshold. Trimming of the reference voltage is also, at the same time, trimming of the power-on reset threshold. Attainment of the minimum operating voltage that is necessary for proper operation of the voltage reference circuit furthermore allows a direct conclusion as to correct ramp-up of the voltage reference circuit. During the ramp-up and ramp-down of the operating voltage, there are no high-resistance nodes in the signal path of the power-on reset signal which might cause the power-on reset signal to indicate operational readiness even though the reference voltage has not reached its target value.

In a preferred embodiment of the present invention, the IPTAT circuit encompasses a first and a second bipolar transistor having different current/voltage characteristic curves, the first bipolar transistor being larger than the second bipolar transistor; an IPTAT circuit resistor; a first current mirror which copies the current flowing through the first bipolar transistor onto a first current path that encompasses the second bipolar transistor; a second current mirror that is connected to the voltage input; and a sixth bipolar transistor and a fourth MOS transistor. A drain terminal of the fourth MOS transistor is connected to the second current mirror; a gate terminal of the fourth MOS transistor is connected to a collector of the second bipolar transistor; and a source terminal of the fourth MOS transistor is connected to the bases of the first, the second, and the sixth bipolar transistors. An emitter of the sixth bipolar transistor is connected to the ground terminal, and a collector of the sixth bipolar transistor is connected to the base of the sixth bipolar transistor. The emitter of the first bipolar transistor is connected via the first resistor to the ground terminal, while the emitter of the second bipolar transistor is connected directly to the ground terminal. The voltage reference circuit furthermore encompasses a second current path between the voltage input and the ground terminal, the second current path encompassing a pull-down resistor having the pull-down resistance value, and the second current mirror copying a current flowing through the fourth MOS transistor onto the second current path, the pull-down resistance value being selected so that a voltage drop across the resistor does not rise further when the current flowing through the fourth MOS transistor is sufficiently high that the first and the second bipolar transistor conduct.

In the preferred embodiment of the present invention, a pull-down resistor reliably pulls a node to ground if the current flowing in the IPTAT circuit is insufficient (LOW level). A value of the pull-down resistance defines the magnitude of the current that is sufficient in terms of the circuit.

The voltage reference circuit can furthermore encompass a third current path between the voltage input and the ground terminal, and a third current mirror. The third current path can encompass a third bipolar transistor, the third current mirror being capable of copying a further current, which flows through the first bipolar transistor, in amplified fashion onto the third current path. The source terminal of the fourth MOS transistor can be connected to a base of the third bipolar transistor.

The current quantity of the further current which the third bipolar transistor is suitable for dissipating is limited, because of the coupling of the source terminal of the fourth MOS transistor to the base of the third bipolar transistor, to the current quantity, proportional to the absolute temperature, that can flow in the IPTAT circuit. Because the amplified copy of the further current is always greater than that current quantity, there can be present at the collector of the third bipolar transistor a voltage that can serve as an indicator that the reference voltage has reached its target value, as long as the amplified copy of the current is not pinched off.

The voltage reference circuit can consequently encompass a pull-down current source that can carry exactly the current quantity proportional to the absolute temperature.

The voltage reference circuit can encompass a first Schmitt trigger that is connected to a node on the second current path, the node being disposed between the current mirror and the pull-down resistor; and a second Schmitt trigger that can be connected to a further node on the third current path. The further node can be disposed between the third current mirror and the third bipolar transistor.

If the operating voltage is high enough that the current in the IPTAT circuit can flow to a sufficient extent, the copy of the current at the pull-down resistor produces a maximum voltage drop, so that the input of the first Schmitt trigger is pulled by the copy of the current toward the positive operating voltage (HIGH level), and the output of that first Schmitt trigger thus supplies a HIGH level.

The amplified copy of the further current can furthermore then be used to pull the input of the second Schmitt trigger toward a positive operating voltage (HIGH level) when that copy of the further current is greater than the copy of the current that can be supplied by the pull-down current source that pulls the input of that second Schmitt trigger toward ground.

That is the case precisely when the reference voltage has just reached its target value.

The voltage reference circuit can furthermore encompass a NAND gate, such that outputs of the first and of the second Schmitt trigger can be connected to inputs of the NAND gate, and an output of the NAND gate can be connected to the signal output in order to furnish a power-on reset signal (RST).

The NAND gate links the output signals of the two Schmitt triggers. The result is to generate a power-on reset signal that reliably assumes a LOW level (no reset) only when the applied operating voltage is sufficiently high that the reference voltage has reached its target value.

A LOW level is then present at the signal output specifically when a HIGH level is present at the respective inputs of the first and of the second Schmitt trigger. The power-on reset signal is therefore set to a LOW level specifically when the reference voltage has just reached its target value, and a current having a sufficient current intensity is additionally flowing in the IPTAT circuit.

The voltage reference circuit can furthermore encompass a fourth current path between the voltage input and the ground terminal, and a fourth current mirror. The fourth current path can encompass a further resistor and a fourth bipolar transistor connected in series. The base and the collector of the fourth bipolar transistor can be connected to one another. The fourth current mirror can be embodied to copy the further current onto the fourth current path. The voltage reference circuit can furthermore also encompass a further node on the fourth current path, which is disposed between the fourth current mirror and the further resistor and is connected to the voltage output in order to furnish a reference voltage.

The voltage reference circuit can furthermore encompass a fifth current mirror that can be embodied to copy the copy, flowing through the fourth current path, of the further current in reduced fashion onto the third current path.

An RC filter can be connected to the voltage input in order to filter the operating voltage.

A timing element can advantageously be used to delay the power-on reset signal.

An integrated circuit on a reference voltage circuit in accordance with the present invention can be used, for example, in a vehicle.

Advantageous refinements of the present invention are described herein.

BRIEF DESCRIPTION OF THE DRAWINGS

Exemplifying embodiments of the present invention will be explained in further detail in the description below with reference to the figures.

DETAILED DESCRIPTION OF EXAMPLE EMBODIMENTS

Figure 2:
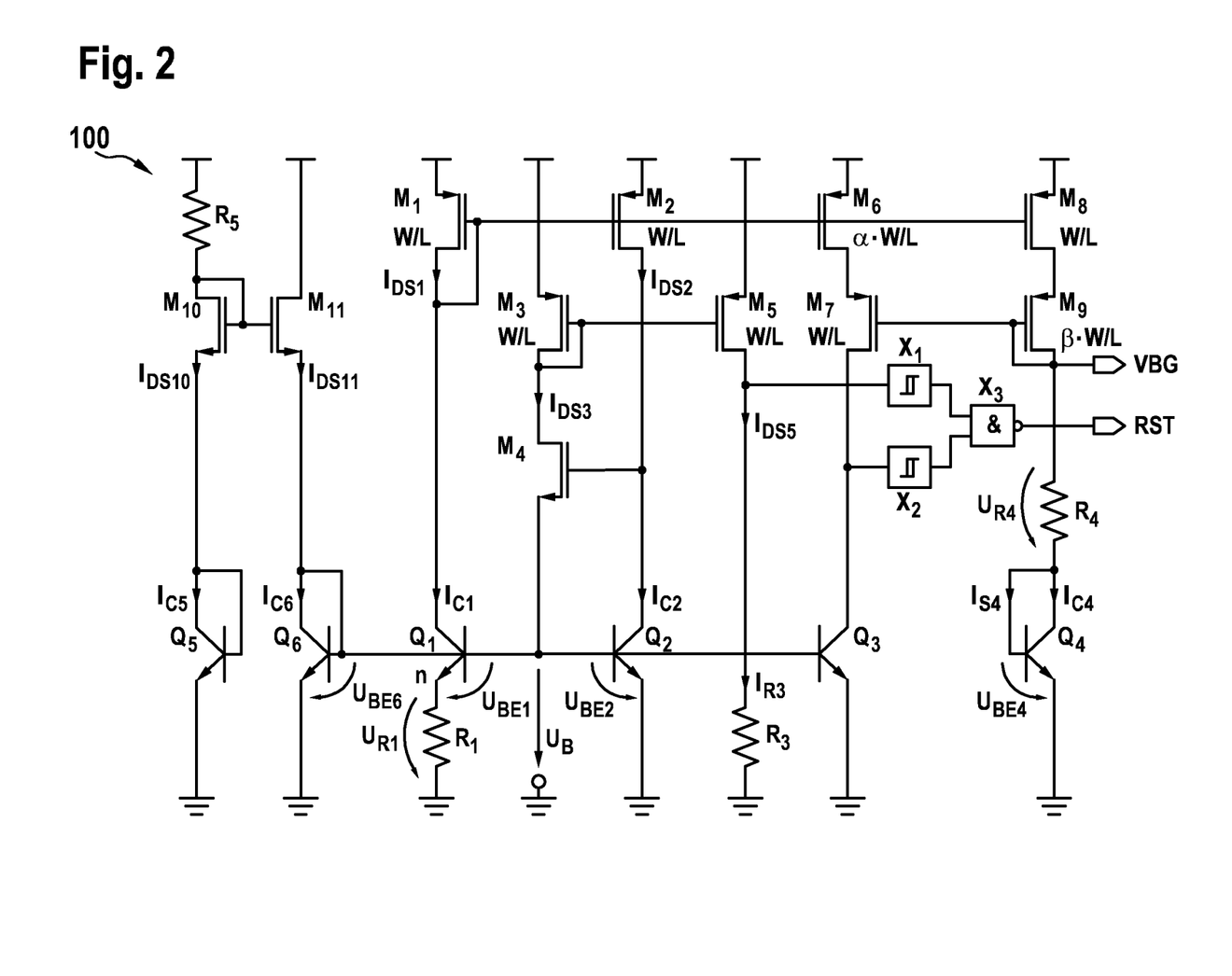
FIG. 2 shows a voltage reference circuit having a combined power-on reset signal, according to an exemplifying embodiment of the present invention.

An exemplifying embodiment of the present invention is provided in the form of a voltage reference circuit 100, for furnishing a reference voltage for an application-specific integrated circuit (ASIC). Voltage reference circuit 100 of this embodiment encompasses a voltage input for applying an operating voltage, and a voltage output for furnishing a reference voltage VBG. The voltage reference circuit furthermore encompasses a signal output for furnishing a power-on reset signal RST. The voltage reference circuit is embodied to furnish the power-on reset signal RST only when the reference voltage reaches its target value.

In the exemplifying embodiment of the present invention, an RC filter is connected to the voltage input in order to filter the operating voltage. The RC filter can, however, be omitted without deviating from the present invention.

FIG. 2 shows a voltage reference circuit in accordance with an exemplifying embodiment of the present invention.

An IPTAT circuit, connected between the voltage input and ground terminal, is encompassed for generation of a current proportional to the absolute temperature.

In the exemplifying embodiment of the present invention, the voltage reference circuit furthermore encompasses two Schmitt triggers X1, X2 and a NAND gate X3. An input of the one Schmitt trigger X1 is connected to a node (the first node). An input of the other Schmitt trigger X2 is connected to a further node (the second node). Outputs of Schmitt triggers X1, X2 are connected to inputs of NAND gate X3. An output of NAND gate X3 is connected to the signal output.

The IPTAT circuit of the exemplifying embodiment of the present invention encompasses an IPTAT circuit resistor R1 as well as a first, a second, a third, and a fourth MOS transistor M1, M2, M3, M4. The IPTAT circuit furthermore encompasses a first, a second, and a sixth bipolar transistor Q1, Q2, and Q6. First and second bipolar transistors Q1, Q2 differ in terms of size. The size ratio is preferably rational, even more preferably natural. First and second MOS transistors M1, M2 are identical in nature.

In the exemplifying embodiment of the present invention, the emitter of second bipolar transistor Q2 is connected directly to ground. In the exemplifying embodiment, the emitter of first bipolar transistor Q1 is connected via IPTAT circuit resistor R1 to ground. In the exemplifying embodiment, the source terminal of first MOS transistor M1, the source terminal of second MOS transistor M2, and the source terminal of third MOS transistor M3 are connected to the operating voltage input. In the exemplifying embodiment, the drain terminal of first MOS transistor M1 is connected to the collector of first bipolar transistor Q1. In the exemplifying embodiment, the drain terminal of second MOS transistor M2 is connected directly to the collector of second bipolar transistor Q2. In the exemplifying embodiment, the drain terminal of third MOS transistor M3 is connected to the drain terminal of fourth MOS transistor M4.

In the exemplifying embodiment of the present invention, the gate of first MOS transistor M1 and the gate of second MOS transistor M2 are connected to a third node. The drain terminal of first MOS transistor M1 is connected to the third node, and the drain terminal of third MOS transistor M3 is connected to the gate of third MOS transistor M3. In the exemplifying embodiment, the base of first bipolar transistor Q1 and the base of second bipolar transistor Q2 are connected to a fourth node. In the exemplifying embodiment, the source terminal of fourth MOS transistor M4 is connected to the fourth node, and the gate of fourth MOS transistor M4 is connected to the collector of second bipolar transistor Q2.

In an exemplifying refinement of the exemplifying embodiment of the present invention, the voltage reference circuit furthermore encompasses a second current path having a fifth MOS transistor M5 that, with third MOS transistor M3, constitutes a second current mirror; and a pull-down resistor R3. The source terminal of fifth MOS transistor M5 is connected to the operating voltage input. The gate of fifth MOS transistor M5 is connected to the gate of third MOS transistor M3. The drain terminal of fifth MOS transistor M5 is connected to the first node. Pull-down resistor R3 is connected between the first node and ground. A current intensity of the current flowing in the IPTAT circuit must exceed a minimum current intensity, dependent on the voltage value of the operating voltage and on the pull-down resistance value of pull-down resistor R3, in order for a voltage to be able to build up at the first node.

In an exemplifying and optional configuration of the exemplifying embodiment, the voltage reference circuit furthermore encompasses a third current path having a third bipolar transistor Q3, a sixth MOS transistor M6, and a seventh MOS transistor M7. In this embodiment, the source terminal of sixth MOS transistor M6 is connected to the operating voltage input. Sixth MOS transistor M6 constitutes, with first MOS transistor M1, a second current mirror. In this embodiment, the drain terminal of sixth MOS transistor M6 is connected to the source terminal of seventh MOS transistor M7. In this embodiment, the drain terminal of seventh MOS transistor M7 is connected to the second node. The collector of third bipolar transistor Q3 is also connected to the second node. In this embodiment, the emitter of third bipolar transistor Q3 is connected to ground. In this embodiment, the base of third bipolar transistor Q3 is connected to the fourth node.

In an optional further embodiment of the present invention, the voltage reference circuit can encompass a fourth current path having yet a further node (the fifth node), a third resistor R4, a fourth bipolar transistor Q4, and an eighth and a ninth MOS transistor M8, M9. The source terminal of eighth MOS transistor M8 can be connected to the operating voltage input. The gate of eighth MOS transistor M8 can be connected to the third node. Eighth MOS transistor M8 constitutes, with first MOS transistor M1, a fourth current mirror. The drain terminal of eighth MOS transistor M8 can be connected to the source terminal of ninth MOS transistor M9. The gate of ninth MOS transistor M9 can be connected to the gate of seventh MOS transistor M7. Seventh MOS transistor M7 constitutes, with ninth MOS transistor M9, a fifth current mirror. The drain terminal of ninth MOS transistor M9 can be connected to the fifth node. The collector of fourth bipolar transistor Q4 can be connected via third resistor R4 to the fifth node. The base of fourth bipolar transistor Q4 can be connected to the collector of fourth bipolar transistor Q4. The emitter of fourth bipolar transistor Q4 can be connected to ground. Reference voltage output VBG, and the gate of ninth MOS transistor M9, can be connected to the fifth node.

In yet another optional embodiment of the present invention, the voltage reference circuit furthermore encompasses a fourth resistor R5, a fifth and a sixth bipolar transistor Q5, Q6, and a tenth and an eleventh MOS transistor M10, M11. The drain terminal of eleventh MOS transistor M11 is connected directly to the operating voltage input, and the drain terminal of tenth MOS transistor M10 is connected via fourth resistor R5 to the operating voltage input. The source terminals of tenth and eleventh MOS transistors M10, M11 are respectively connected to the collectors of fifth and sixth bipolar transistors Q5, Q6. The emitters of fifth and sixth bipolar transistors Q5, Q6 are connected to ground. The base of fifth bipolar transistor Q5 is connected to the collector of fifth bipolar transistor Q5, and the base of sixth bipolar transistor Q6 is connected to the collector of sixth bipolar transistor Q6. The base of sixth bipolar transistor Q6 is furthermore connected to the fourth node.

An integrated circuit having a reference voltage circuit in accordance with the present invention can be utilized, for example, in a vehicle.

In an exemplifying embodiment of the present invention, a voltage reference circuit reliably signals, via a dedicated inherent power-on reset signal, when the operating voltage made available to it is just high enough that its target reference voltage value is just attained. In this exemplifying embodiment, neither a second internal or external reference voltage, nor a separate power-on reset circuit, is necessary for that purpose.

The functionality of the exemplifying embodiment shown in FIG. 2 of the voltage reference circuit provided according to the present invention will be described in more detail below. The two bipolar transistors Q1 and Q2, IPTAT circuit resistor R1, and the current mirror constituted from M1 and M2 cause the collector currents IC1, IC2 and drain-source currents IDS1, IDS2 to become established, proportionally to the absolute temperature, correspondingly to those in the circuit in FIG. 1:

$$IC1=IC2=IDS1=IDS2=IPTAT=1/R1\times kT/q\times \ln(n)$$

The base voltage UB of Q1 and Q2 is regulated by M4. If the current IPTAT is too low, the collector current IC1 of Q1, because of the latter's area that is greater by a factor of n, is higher than that of Q2, so that the gate of M4 is pulled upward by MOS transistor M2 and the current IPTAT rises. If the current IPTAT is too high, the collector current IC1, because of the current feedback of Q1 (brought about by IPTAT circuit resistor R1), is then lower than that of Q2, so that the gate of M4 is pulled downward by bipolar transistor Q2 and the current IPTAT drops. The base voltage UB that occurs is, for the same dimensioning, approximately the same as in the circuit in FIG. 1.

Because of M8, the current IPTAT also flows through R4 and through Q4, where IR4=IC4=IPTAT (IB4 being negligible). Because Q2 and Q4 are identical in nature, then because IC2=IC4 (and ignoring IB4) they also have the same base-emitter voltage UBE2=UBE4. Analogously to the circuit in FIG. 1, it is possible to find a resistor R4 for which the sum of the voltage drop UR4 across R4 (due to the collector current IC4=IPTAT flowing through it), and the base-emitter voltage UBE4, is independent of temperature to a first approximation. Here as well, the bandgap voltage of approx. 1.25 V is again produced at output pin VBG regardless of the semiconductor technology that is used.

Startup Circuit

A startup circuit is advantageous for starting up the voltage reference circuit. The startup circuit is constituted by resistor R5, MOS transistors M10, M11, and bipolar transistors Q5, Q6. As soon as the operating voltage is high enough, the current IDS10 flows through resistor R5 and MOS transistors M10 and Q5. Assuming that M10 and M11 are identical in nature, and that Q5 and Q6 are identical in nature (and ignoring the base currents of Q1, Q2, and Q3), the same current also flows through MOS transistors M11 and Q6 (IDS11=IDS10).

Resistor R5 should be dimensioned so that IDS11<<IPTAT over the entire temperature range.

Because the bases of Q1 and Q2 are connected to the base of Q6, collector currents IC1 and IC2 also flow through bipolar transistors Q1 and Q2. As long as bipolar transistors Q1 and Q2 have not yet reached their working points, because the currents IC1 and IC2 are lower than the above-described current IPTAT (because the operating voltage is too low), the collector current IC1 of Q1 is higher (because its area is greater by the factor n) than that of Q2, so that the gate of M4 is pulled upward by MOS transistor M2 and the current IPTAT rises further, until the above-described working point becomes established and the bandgap voltage of approx. 1.25 V is produced.

Generation of a Power-On Reset Signal

MOS transistor M4 must supply the collector current for sixth bipolar transistor Q6 and the base currents for first, second, third, and sixth bipolar transistors Q1, Q2, Q3, Q6. This is not possible until the operating voltage is sufficiently high that third and fourth MOS transistors M3, M4, and the base-emitter sections of first, second, and sixth bipolar transistors Q1, Q2, and Q6, are conducting. Because of the current mirror constituted from third and fifth MOS transistors M3, M5, and assuming that M3 and M5 are identical in nature, the current furnished by fourth MOS transistor M4 also flows through pull-down resistor R3 (IR3=IDS5=IDS3). As the operating voltage rises, the voltage drop across pull-down resistor R3 at first also rises. As soon as bipolar transistors Q1 and Q2 have reached their working point, the voltage drop across pull-down resistor R3 no longer rises. The voltage drop across pull-down resistor R3 also can rise only to a point such that it does not fall below the drain-source saturation voltage of fifth MOS transistor M5, so that fifth MOS transistor M5 can still function as a current source.

The voltage drop across pull-down resistor R3 can correspondingly extend just to the operating voltage. It is possible to find a resistance value for pull-down resistor R3 such that the voltage drop across it brings about a logical HIGH signal at the output of Schmitt trigger X1 if the current furnished by fourth MOS transistor M4 is sufficient that bipolar transistors Q1 and Q2 start to conduct, and regulation of the gate voltage begins.

Because the base of Q6 is connected to the bases of Q1 and Q2, the collector current IC6 of Q6 also corresponds to that of Q1 and Q2 (IC6=IC1=IC2=IPTAT). The current IPTAT therefore (ignoring the base currents of Q1, Q2, Q3, and Q6) also flows through MOS transistors M4, M3, and M5, and through pull-down resistor R3 (IR3=IDS5=IDS3=IDS4=IC6=IPTAT). The voltage drop across R3 is likewise correspondingly temperature-dependent because of the temperature dependence of IPTAT. It can therefore be advantageous to insert into the collector path of Q6 a resistor R6 that limits the collector current of Q6 at high temperatures. This can make possible a wider value range for pull-down resistor R3. The base of Q6 would then continue to be connected to the source terminal of M11, and the collector of Q6 would be connected via resistor R6 to the source terminal of M11.

If the operating voltage is too low, pull-down resistor R3 reliably pulls the input of the one Schmitt trigger X1 to ground, and its output carries a logical LOW signal. The downstream NAND gate X3 then carries a logical HIGH signal at its output. The output of NAND gate X3 is the power-on reset signal RST. The power-on reset signal RST cannot go to LOW until the other Schmitt trigger X2 is also carrying a HIGH signal at its output. This requires that the operating voltage be sufficiently high that eighth and ninth MOS transistors M8 and M9 are conductive, and the drain-source currents IDS8 and IDS9, and the collector current IC4, correspond to IC1=IC2=IPTAT. That is the case if those values do not fall below the drain-source saturation voltage of eighth MOS transistor M8, so that eighth MOS transistor M8 can act without impairment as a current source, and if a gate-source voltage of ninth MOS transistor M9 can be established which, in accordance with the characteristic curve IDS9 (UGS9) of ninth MOS transistor M9, can carry the drain-source current IDS9=IPTAT, and if fourth bipolar transistor Q4, in accordance with its characteristic curve IC4 (UBE4), can carry the collector current IC4=IPTAT. Because of the factor α, where α is slightly greater than one (e.g. α=1.1 or α=1.2), current source M6 is slightly stronger than current source Q3, so that the input of the other Schmitt trigger X2 is pulled by M6 to a value close to the operating voltage as soon as the current IPTAT can flow through M8, M9, R4, and Q4, and as soon as the value does not fall below drain-source saturation voltage of sixth MOS transistor M6, so that sixth MOS transistor M6 can also operate without impairment as a current source and can furnish a current IDS6=α×IPTAT>IC3=IPTAT. That occurs, approximately, when reference voltage VBG has just reached its target value of 1.25 V. By way of a factor β>1 (e.g. β=2 or β=4), that switching point can be shifted increasingly toward small offsets from the target value, since as a result (as the factor β becomes greater) the gate-source voltage of M9 can be made smaller with respect to the gate-source voltage of M7, and the drain-source voltage of M6 can thus simultaneously be reduced. The drain-source voltage of M6 is influenced by the gate-source voltage of M7 and the gate-source voltage of M9. Because the gates of M7 and M9 are connected to one another, the result is that the sum of the drain-source voltage of M6 and the gate-source voltage of M7 corresponds to the sum of the drain-source voltage of M8 and the gate-source voltage of M9 (UDS6+UGS7=UDS8+UGS9). As long as the current IPTAT cannot flow through M8, M9, R4, and Q4, because the value is below the drain-source saturation voltage of M8, the current α×IPTAT also cannot be furnished by M6, since (because UDS6+UGS7=UDS8+UGS9) the value has also fallen below the drain-source saturation voltage of M8, and M8 then cannot function without impairment as a current source. With suitable dimensioning, the drain-source saturation voltage can be equal to approx. 200 mV.

The voltage reference circuit proposed here thus signals its operational readiness, via the power-on reset signal RST, upon attainment of the target value of the reference voltage as a function of the applied operating voltage, with a LOW level. If the operating voltage is too low, the RST signal is reliably HIGH.

This is true starting at an operating voltage that is sufficient to drive a NAND gate and a Schmitt trigger, i.e. an operating voltage that, for example, exceeds the threshold voltage of a PMOS transistor or that of an NMOS transistor, depending on which of the two threshold voltages is higher. This lower limit above which the power-on reset signal achieves its validity does not represent a disadvantage in practice, and is entirely sufficient in particular for a digital circuit or the digital portion of an ASIC. The power-on reset signal RST can, however, also easily be converted, with a downstream inverter made up of an MOS transistor and a resistor, into a signal that is already valid starting at the operating voltage of 0 V. As soon as that signal passes through a single logical gate, however (e.g., an inverter, an OR gate, or an AND gate), the lower limit of a threshold voltage of a PMOS transistor or of an NMOS transistor (depending on which of the two threshold voltages is higher) would once again apply to the operating voltage above which the signal is valid.

The temperature profile of this voltage reference can be trimmed via IPTAT circuit resistor R1 or third resistor R4. Separate trimming of the power-on reset threshold is not necessary. The voltage reference circuit proposed here will always reliably signal the fact that the reference voltage target value has been reached.

Resistor R4 can be split into the series circuit of two resistors R4A and R4B, which thus constitute a voltage divider. The gates of M7 and M8 can be connected to the output of that voltage divider (i.e., between R4A and R4B). With suitable dimensioning of this voltage divider, the reference voltage can thus reach its target value at an even lower operating voltage.

Cascode transistors can also be used respectively for MOS transistors M1, M2, M6, and M8 and/or for bipolar transistors Q1 and Q2. The power supply rejection ratio can thereby advantageously be increased.

The Q1/Q2 size ratio can be selected to equal n/m, where n and m are natural numbers and m>1 and n>1. Bipolar transistors Q3, Q5, and Q6 contain the size factor 1. Q4 gets size factor m. The collector currents of bipolar transistors Q3, Q5, and Q6 can thereby be reduced with respect to those of bipolar transistors Q1, Q2, and Q4 in order to decrease the total power loss of the circuit.

Because the power consumption of this voltage reference circuit can be in the single-digit μA range, an RC filter on a series resistor in the range of a few 10 s to 100 kilohm can be used as an input filter for the operating voltage.

A timing element can delay the trailing edge of the RST signal in order to implement a defined power-on reset phase even in a context of smaller, shorter interruptions in the operating voltage.

The present invention helps to alleviate a very common recurring problem with regard to the ramp-up and ramp-down of application-specific (and other) integrated circuits.

In an exemplifying embodiment of the present invention, a voltage reference circuit reliably signals, via a dedicated inherent power-on reset signal, when the operating voltage available to it is just high enough that its reference voltage target value is just reached. In this exemplifying embodiment, neither a second internal or external reference, nor a separate power-on reset circuit, is necessary for that purpose.

What is claimed is:

1. A voltage reference circuit for furnishing a reference voltage for an application-specific integrated circuit, comprising:
   a voltage input for applying an operating voltage;
   a ground terminal;
   a voltage output for furnishing a reference voltage;
   a signal output for furnishing a power-on reset signal; and
   a current-proportional-to-absolute-temperature (IPTAT) circuit, connected between the voltage input and ground terminal, configured to generate a current proportional to the absolute temperature, the voltage reference circuit being configured to furnish the power-on reset signal only when the reference voltage has reached a target value and when additionally a current is flowing in the IPTAT circuit at a current intensity that reaches or exceeds a minimum current intensity determined by a voltage value of the operating voltage and by a pull-down resistance value.

2. The voltage reference circuit as recited in claim 1, wherein the IPTAT circuit includes:
   a first bipolar transistor and a second bipolar transistor having different current/voltage characteristic curves, the first bipolar transistor being larger than the second bipolar transistor;
   an IPTAT circuit resistor, an emitter of the first bipolar transistor being connected via the IPTAT circuit resistor to the ground terminal and an emitter of the second bipolar transistor being connected directly to the ground terminal;
   a first current mirror which copies current flowing through the first bipolar transistor onto a first current path that includes the second bipolar transistor;
   a second current mirror;
   a fourth MOS transistor; and
   a sixth bipolar transistor, a drain terminal of the fourth MOS transistor being connected to the voltage input, a gate terminal of the fourth MOS transistor being connected to a collector of the second bipolar transistor, and a source terminal of the fourth MOS transistor being connected to bases of the first bipolar transistor, the second bipolar transistor, and the sixth bipolar transistor; and
   wherein the voltage reference circuit further comprises:
      a second current path between the voltage input and the ground terminal, an emitter of the sixth bipolar transistor being connected to the ground terminal, and a collector of the sixth bipolar transistor being connected to the base of the sixth bipolar transistor, the second current path including a pull-down resistor having the pull-down resistance value, and the second current mirror copying a current flowing through the fourth MOS transistor onto the second current path, the pull-down resistance value being selected so that a voltage drop across the pull-down resistor does not rise further when the current flowing through the fourth MOS transistor is sufficiently high that the first bipolar transistor and the second bipolar transistor conduct.

3. The voltage reference circuit as recited in claim 2, further comprising:
   a third current path between the voltage input and the ground terminal; and
   a third current mirror, the third current path including a third bipolar transistor, the third current mirror copying a further current, which flows through the first bipolar transistor, in amplified fashion onto the third current path, and the source terminal of the fourth MOS transistor being connected to a base of the third bipolar transistor.

4. The voltage reference circuit as recited in claim 3, further comprising:
   a first Schmitt trigger connected to a first node on the second current path, the first node being disposed between the second current mirror and the pull-down resistor; and a second Schmitt trigger connected to a second node on the third current path, the second node being disposed between the third current mirror and the third bipolar transistor.

5. The voltage reference circuit as recited in claim 4, further comprising:
a NAND gate, outputs of the first Schmitt trigger and of the second Schmitt trigger being connected to inputs of the NAND gate, and an output of the NAND gate being connected to the signal output to furnish the power-on reset signal.

6. The voltage reference circuit as recited in claim 3, further comprising:
a fourth current path between the voltage input and the ground terminal;
a fourth current mirror, the fourth current path including a further resistor and a fourth bipolar transistor connected in series, a base of the fourth bipolar transistor and a collector of the fourth bipolar transistor being connected to one another, and the fourth current mirror copying the further current onto the fourth current path; and
a further node on the fourth current path, which is disposed between the fourth current mirror and the further resistor and is connected to the voltage output to furnish the reference voltage.

7. The voltage reference circuit as recited in claim 6, further comprising:
a fifth current mirror that copies the copy, flowing through the fourth current path, of the further current in reduced fashion onto the third current path.

8. The voltage reference circuit as recited in claim 1, further comprising:
an RC filter configured to filter the operating voltage, the RC filter being connected to the voltage input.

9. The voltage reference circuit as recited in claim 1, further comprising:
a timing element configured to delay the power-on reset signal.

10. A vehicle having an integrated circuit on a reference voltage circuit, the reference voltage circuit configured to furnish a reference voltage for the integrated circuit, the reference voltage circuit comprising:
a voltage input for applying an operating voltage;
a ground terminal;
a voltage output for furnishing a reference voltage;
a signal output for furnishing a power-on reset signal; and
a current-proportional-to-absolute-temperature (IPTAT) circuit, connected between the voltage input and ground terminal, configured to generate a current proportional to the absolute temperature, the voltage reference circuit being configured to furnish the power-on reset signal only when the reference voltage has reached a target value and when additionally a current is flowing in the IPTAT circuit at a current intensity that reaches or exceeds a minimum current intensity determined by a voltage value of the operating voltage and by a pull-down resistance value.

* * * * *